(12) United States Patent
Yamada

(10) Patent No.: US 12,148,872 B2
(45) Date of Patent: Nov. 19, 2024

(54) DISPLAY DEVICE AND METHOD OF MANUFACTURING THE SAME

(71) Applicant: Japan Display Inc., Tokyo (JP)

(72) Inventor: Kazuyuki Yamada, Tokyo (JP)

(73) Assignee: Japan Display Inc., Tokyo (JP)

( * ) Notice: Subject to any disclaimer, the term of this patent is extended or adjusted under 35 U.S.C. 154(b) by 459 days.

(21) Appl. No.: 17/569,351

(22) Filed: Jan. 5, 2022

(65) Prior Publication Data

US 2022/0131059 A1 Apr. 28, 2022

Related U.S. Application Data

(63) Continuation of application No. PCT/JP2020/026471, filed on Jul. 6, 2020.

(30) Foreign Application Priority Data

Jul. 11, 2019 (JP) ................... 2019-129159

(51) Int. Cl.
*H01L 33/62* (2010.01)
*H01L 27/12* (2006.01)
(Continued)

(52) U.S. Cl.
CPC ............ *H01L 33/62* (2013.01); *H01L 27/124* (2013.01); *H01L 27/156* (2013.01); *H01L 33/005* (2013.01); *H01L 2933/0066* (2013.01)

(58) Field of Classification Search
CPC ..... H01L 33/62; H01L 27/124; H01L 27/156; H01L 33/005; H01L 2933/0066;
(Continued)

(56) References Cited

U.S. PATENT DOCUMENTS

2003/0170971 A1* 9/2003 Tomoda ................ H01L 24/82
438/46
2014/0367705 A1* 12/2014 Bibl ....................... H01L 33/44
438/27
(Continued)

FOREIGN PATENT DOCUMENTS

JP 2014-197619 A 10/2014

OTHER PUBLICATIONS

International Search Report mailed on Aug. 21, 2020 for PCT Application No. PCT/JP2020/026471, with English translation.
(Continued)

*Primary Examiner* — S M Sohel Imtiaz
(74) *Attorney, Agent, or Firm* — Michael Best & Friedrich LLP

(57) ABSTRACT

According to one embodiment, a display device includes a substrate, a drive transistor that is provided on above the substrate, a first insulating layer that is provided above the substrate, a first mounting electrode that is arranged above the first insulating layer, and a light emitting element that is mounted on the first mounting electrode and has a first electrode and a second electrode, the first electrode being electrically connected to the first mounting electrode. The first mounting electrode and the first electrode are made of a metal material and joined to each other. The first mounting electrode has at least one first through hole at a position overlapping the first electrode in plan view.

10 Claims, 7 Drawing Sheets

(51) Int. Cl.
*H01L 27/15* (2006.01)
*H01L 33/00* (2010.01)

(58) Field of Classification Search
CPC . H01L 25/167; G09F 9/00; G09F 9/30; G09F 9/33
See application file for complete search history.

(56) References Cited

U.S. PATENT DOCUMENTS

| | | | |
|---|---|---|---|
| 2016/0155782 A1* | 6/2016 | Sato | H10K 59/60 257/82 |
| 2017/0179158 A1* | 6/2017 | Lee | H01L 21/44 |
| 2018/0068986 A1* | 3/2018 | Yoo | H01L 33/0075 |
| 2018/0068995 A1 | 3/2018 | Kajiyama | |
| 2018/0145056 A1 | 3/2018 | Yoo et al. | |
| 2018/0122836 A1* | 5/2018 | Kang | H01L 27/1248 |
| 2018/0342570 A1* | 11/2018 | Hong | H10K 59/1216 |
| 2020/0279870 A1* | 9/2020 | Yoon | H01L 27/1248 |
| 2022/0262984 A1* | 8/2022 | Choi | H01L 33/505 |

OTHER PUBLICATIONS

Taiwan Office Action, Application No. 109123384, dated Apr. 28. 2021.
Taiwan Decision of Refusal, Application No. 109123384, dated Sep. 22, 2021.

* cited by examiner

DISPLAY DEVICE AND METHOD OF MANUFACTURING THE SAME

CROSS-REFERENCE TO RELATED APPLICATIONS

This application is a Continuation Application of PCT Application No. PCT/JP2020/026471, filed Jul. 6, 2020 and based upon and claiming the benefit of priority from Japanese Patent Application No. 2019-129159, filed Jul. 11, 2019, the entire contents of all of which are incorporated herein by reference.

FIELD

Embodiments described herein relate generally to a display device and a method of manufacturing the same.

BACKGROUND

An LED display using a light-emitting diode (LED) which is a spontaneous light-emitting element is known. In recent years, as a display device with higher definition, a display device (hereinafter, referred to as a micro LED display) using a minute light-emitting diode element called a micro LED has been developed.

Unlike a conventional liquid crystal display or organic EL display, the micro LED display is formed by mounting a large number of chip-like micro LEDs in a display area. Therefore, the micro LED display is easy to achieve both high definition and increase in size, and therefore, is attracting attention as a next-generation display.

In the manufacturing of the micro LED display, a method of mounting a micro LED on an array substrate is adopted. In this method, an electrode of a micro LED is made to abut on a mounting electrode on an array substrate, a laser is irradiated from the array substrate side to a region where the electrodes overlap, and the micro LED is mounted (joined) to the mounting electrode on the array substrate by energy of the laser.

However, in such a mounting method, the laser is shielded by the mounting electrode made of metal and attenuated. For this reason, the energy of the laser does not sufficiently reach a joining interface between the electrode of the micro LED and the mounting electrode, and there is a possibility that metal joining between the mounting electrode and the electrode of the micro LED becomes insufficient.

DETAILED DESCRIPTION

Figure 1:
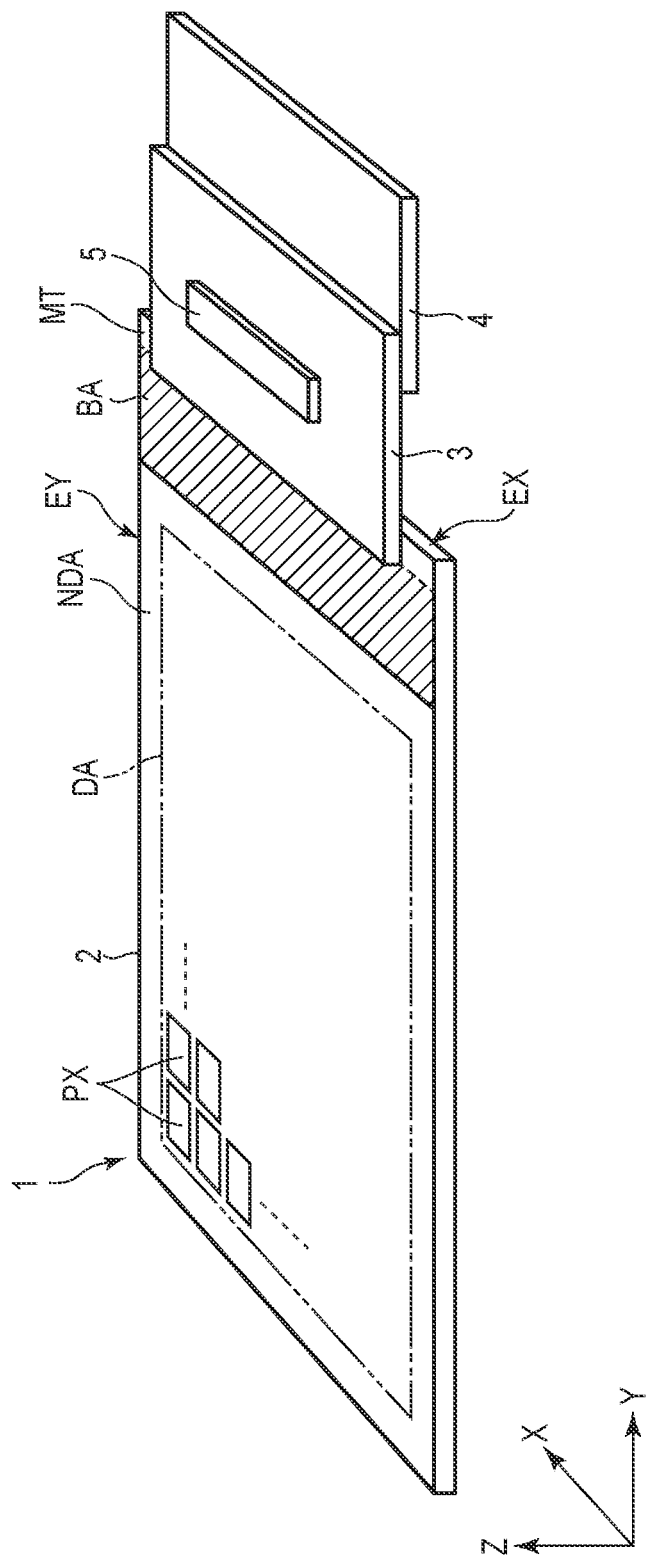
FIG. 1 is a perspective view schematically illustrating a configuration of a display device according to a first embodiment.

In general, according to one embodiment, a display device includes a substrate; a drive transistor that is provided on above the substrate; a first insulating layer that is provided above the substrate so as to cover the drive transistor; a first mounting electrode that is arranged above the first insulating layer, and receives a signal having a controlled current value from the drive transistor; and a light emitting element that is mounted on the first mounting electrode and has a first electrode and a second electrode, the first electrode being electrically connected to the first mounting electrode. The first mounting electrode and the first electrode are made of a metal material and joined to each other. The first mounting electrode has at least one first through hole at a position overlapping the first electrode in plan view.

According to another embodiment, a method of manufacturing a display device is provided. The display device includes a substrate, a drive transistor that is provided above the substrate, a first insulating layer that is provided above the substrate so as to cover the drive transistor, a first mounting electrode that is arranged above the first insulating layer, and receives a signal having a controlled current value from the drive transistor, and a light emitting element that is mounted on the first mounting electrode and has a first electrode and a second electrode, the first electrode being electrically connected to the first mounting electrode. The first mounting electrode and the first electrode are made of a metal material and joined to each other. The first mounting electrode has at least one first through hole at a position overlapping the first electrode in plan view. The method includes radiating a laser from the substrate side through the first through hole to join the first mounting electrode and the first electrode.

According to another embodiment, a method of manufacturing a display device is provided. The display device includes a substrate, a drive transistor that is provided above the substrate, a first insulating layer that is provided above the substrate so as to cover the drive transistor, a first mounting electrode that is arranged above the first insulating layer, and receives a signal having a controlled current value from the drive transistor, a second mounting electrode that is arranged above the first insulating layer, and a light emitting element that is mounted on the first mounting electrode and the second mounting electrode and has a first electrode and a second electrode, the first electrode being electrically connected to the first mounting electrode, and the second electrode being electrically connected to the second mounting electrode. The first mounting electrode and the first electrode are made of a metal material and joined to each other. The second mounting electrode and the second electrode are made of a metal material and joined to each other. The first mounting electrode has at least one first through hole at a position overlapping the first electrode in plan view. The second mounting electrode has at least one second through hole at a position overlapping the second electrode in plan view. The method includes radiating a laser from the substrate side through the first through hole and the second through hole to join between the first mounting electrode and the first electrode and the second mounting electrode and the second electrode, respectively.

The present embodiment can provide a display device that can strengthen joining between an array substrate and a micro LED when mounting the micro LED.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

First, a display device according to a first embodiment will be described. Hereinafter, in the present embodiment, a case where a display device 1 is a micro LED display device using a micro light-emitting diode (hereinafter, referred to as a micro LED) which is a spontaneous light-emitting element will be described.

FIG. 1 is a perspective view schematically illustrating a configuration of a display device 1 according to an embodiment. FIG. 1 illustrates a three-dimensional space defined by a first direction X, a second direction Y perpendicular to the first direction X, and a third direction Z perpendicular to the first direction X and the second direction Y. Note that, the first direction X and the second direction Y are orthogonal to each other, but may intersect at an angle other than 90°. In addition, in the present embodiment, the third direction Z is defined as upward, and a direction opposite to the third direction Z is defined as downward. In the case of "a second member above a first member" and "the second member below the first member", the second member may be in contact with the first member or may be located away from the first member.

As illustrated in FIG. 1, the display device 1 includes a display panel 2, a first circuit board 3, a second circuit board 4, and the like.

The display panel 2 has a rectangular shape in an example. In the illustrated example, a short side EX of the display panel 2 is parallel to the first direction X, and a long side EY of the display panel 2 is parallel to the second direction Y. The third direction Z corresponds to a thickness direction of the display panel 2. A main surface of the display panel 2 is parallel to an X-Y plane defined by the first direction X and the second direction Y. The display panel 2 includes a display area DA and a non-display region NDA outside the display area DA. The non-display region NDA has a terminal region MT. In the illustrated example, the non-display region NDA surrounds the display area DA.

The display area DA is an area for displaying an image, and includes, for example, a plurality of main pixels PX arranged in a matrix. The terminal region MT is provided along the short side EX of the display panel 2 and includes a terminal for electrically connecting the display panel 2 to an external device or the like.

The first circuit board 3 is mounted on the terminal region MT, and is electrically connected to the display panel 2. The first circuit board 3 is, for example, a flexible printed circuit board. The first circuit board 3 includes a driver IC chip (hereinafter, referred to as a panel driver) 5 or the like that drives the display panel 2. Note that, in the illustrated example, the panel driver 5 is arranged on the first circuit board 3, but may be arranged below the first circuit board 3. Further, the panel driver 5 may be mounted on components other than the first circuit board 3, for example, may be mounted on the display panel 2, or may be mounted on the second circuit board 4, for example. The second circuit board 4 is, for example, a rigid printed circuit board. The second circuit board 4 is connected to the first circuit board 3, for example, below the first circuit board 3.

The above-described panel driver 5 is connected to a control board (not illustrated) through the second circuit board 4, for example. The panel driver 5 drives the plurality of main pixels PX based on, for example, a video signal output from the control board. Thus, the panel driver 5 performs control for displaying an image on the display panel 2.

Note that, the display panel 2 may have a fold region BA indicated by hatching. The fold region BA is a region that is folded when the display device 1 is housed in a housing of an electronic device or the like. The fold region BA is located on the terminal region MT side of the non-display region NDA. The first circuit board 3 and the second circuit board 4 are arranged below the display panel 2 so as to face the display panel 2 by folding the fold region BA.

Figure 2:
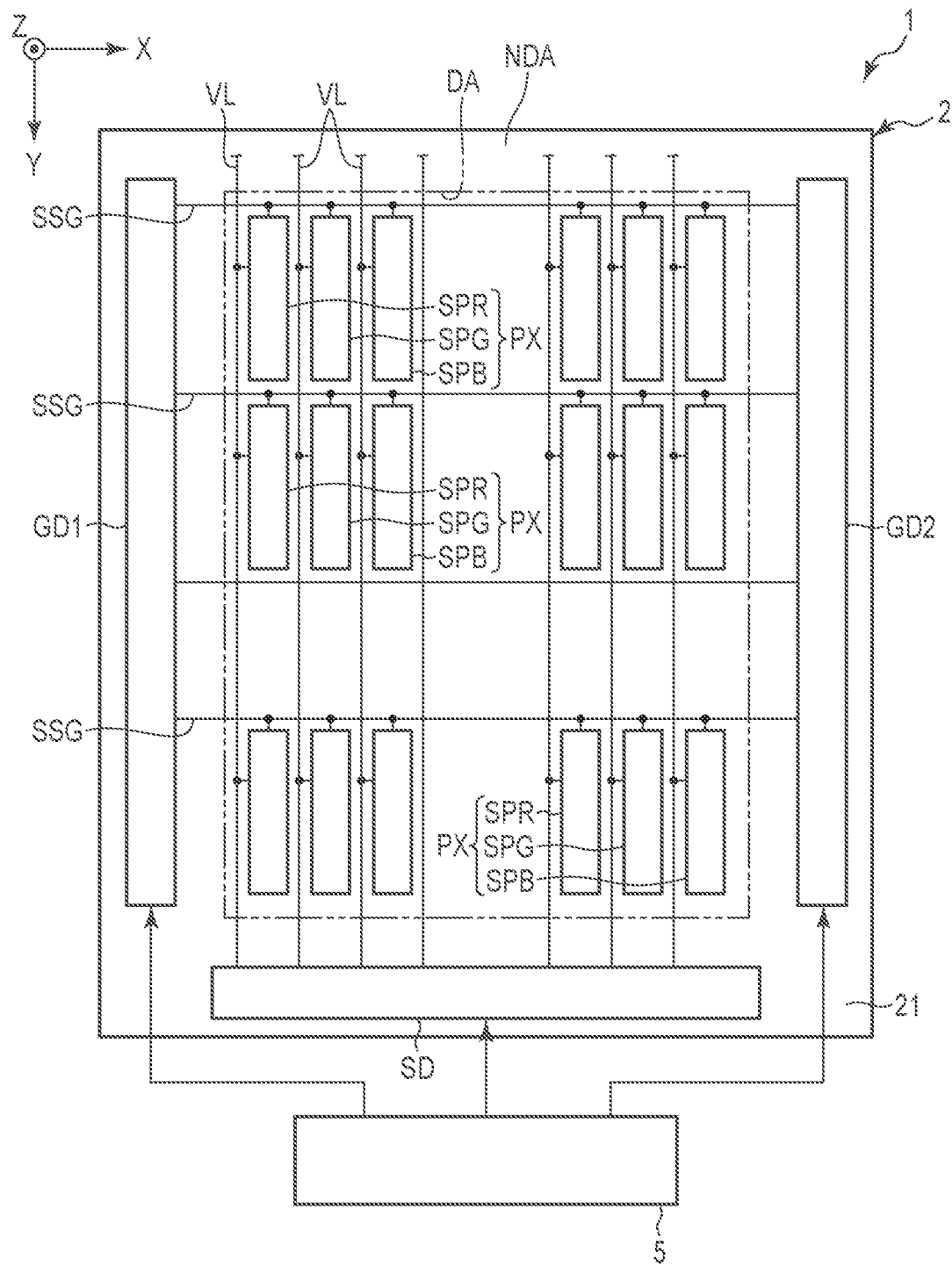
FIG. 2 is a plan view illustrating an example of a circuit configuration of a display device 1 of FIG. 1.

FIG. 2 is a plan view illustrating an example of a circuit configuration of the display device 1.

As illustrated in FIG. 2, the display device 1 includes an active matrix-type display panel 2. The display panel 2 includes an insulating substrate 21, a plurality of main pixels PX arranged on the insulating substrate 21, various wirings, gate drivers GD1 and GD2, and a select circuit SD.

The plurality of main pixels PX are arranged in a matrix in the display area DA described above. Each main pixel PX includes a plurality of sub-pixels SP. In the present embodiment, the main pixel PX includes three types of sub-pixels of a first pixel SPR exhibiting a first color, a second pixel SPG exhibiting a second color, and a third pixel SPB exhibiting a third color. Here, the first color is red, the second color is green, and the third color is blue.

The main pixel PX includes a light emitting element (micro LED) and a pixel circuit for driving the light emitting element. The pixel circuit includes a drive transistor, various switching elements, and the like described later. Various switching elements and the like may include a pixel switch, an initialization switch, a storage capacitance, auxiliary capacitance, and the like, but details thereof are omitted here. The drive transistor, the pixel switch, and the initialization switch are formed of, for example, a thin film transistor (TFT). In the present embodiment, the terms of the main pixel PX and the sub-pixel SP have been described, but PX can be rephrased as a pixel and SP as a sub-pixel.

Various wirings extend in the display area DA and are drawn out to the non-display region NDA. FIG. 2 illustrates a plurality of control lines SSG and a plurality of image signal lines VL as a part of various wirings. The gate drivers GD1 and GD2 and the select circuit SD are located in the non-display region NDA. In the display area DA, the control line SSG and an image signal line VL are connected to the pixel SP. The control line SSG is connected to the gate drivers GD1 and GD2 in the non-display region NDA. The image signal line VL is connected to the select circuit SD in the non-display region NDA.

Various signals or voltages are supplied from the panel driver 5 to the gate drivers GD1 and GD2 and the select circuit SD.

Figure 3:
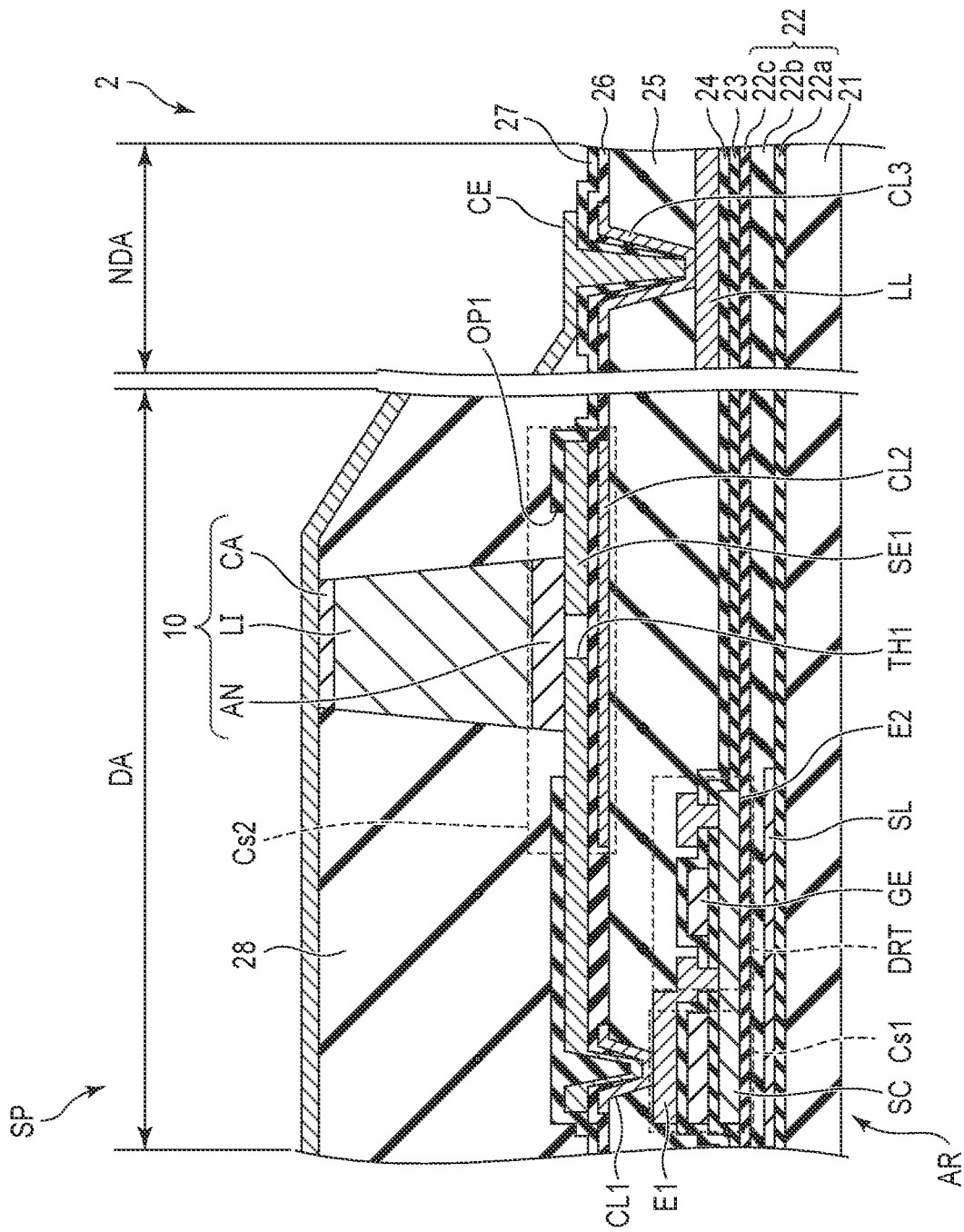
FIG. 3 is a diagram schematically illustrating an example of a partial cross-sectional structure of the display device in FIG. 1.

FIG. 3 is a diagram schematically illustrating an example of a partial cross-sectional structure of the display device. Here, an example will be described in which the above-described micro LED is mounted on a first mounting electrode SE1 as a display element.

An array substrate AR of the display panel 2 illustrated in FIG. 3 includes an insulating substrate 21.

The insulating substrate 21 is not particularly limited as long as it is made of a material that withstands a processing temperature at the time of manufacturing a TFT, but for example, a glass substrate such as quartz or alkali-free glass, or a resin substrate such as polyimide can be used. When the insulating substrate 21 is a flexible resin substrate, the display device 1 can be a sheet display. Note that, when the resin substrate such as polyimide is used for the insulating substrate 21, the insulating substrate 21 can be referred to as an organic insulating layer or a resin layer.

An undercoat layer 22 is provided on the insulating substrate 21. The undercoat layer 22 is an inorganic insulating layer including a single layer or a plurality of layers.

The undercoat layer 22 is not particularly limited as long as it is made of an inorganic insulating layer, and for example, one having a three-layer stacked structure in which a lower layer 22a is a silicon oxide film ($SiO_2$), an intermediate layer 22b is a silicon nitride film (SiN), and an upper layer 22c is a silicon oxide film ($SiO_2$) can be used. In the undercoat layer 22 having such a configuration, the lower layer 22a can improve adherence of a semiconductor layer SC described later to the insulating substrate 21, the intermediate layer 22b can block diffusion of moisture and impurities from the outside to the semiconductor layer SC described later, and the upper layer 22c can block diffusion of hydrogen atoms contained in the intermediate layer 22b to the semiconductor layer SC described later. Note that, when a glass substrate is used as the insulating substrate 21, the lower layer 22a may not be provided. This is because the silicon nitride (SiN) as the intermediate layer 22b has good adherence to the glass substrate.

A light shielding layer SL is arranged above the insulating substrate 21. The light shielding layer SL is arranged in accordance with a location where various TFTs such as the drive transistor DRT are arranged in plan view.

The light shielding layer SL is not particularly limited as long as it is made of a light shielding material, and for example, a metal layer, a black resin layer, or the like can be used. According to the light shielding layer SL, it is possible to suppress entry of light from the insulating substrate 21 side into a channel region of the TFT, and it is possible to suppress a change in characteristics of the TFT caused by the light. Note that, in a case where a conductive material such as a metal layer is used for the light shielding layer SL, a predetermined potential can be applied to the light shielding layer SL to impart a back gate effect to the TFT.

Various thin film transistors (TFT) such as the drive transistor DRT are formed above the undercoat layer 22. In the present embodiment, the TFT such as the drive transistor DRT is a top-gate TFT using polycrystalline silicon for the semiconductor layer SC, and is an N-channel type TFT (NchTFT). Note that, the TFT may be a bottom-gate TFT, a P-channel type (PchTFT) TFT, or a configuration in which TFTs are mixed in the respective configurations.

The TFT such as the drive transistor DRT includes a semiconductor layer SC, a gate electrode GE, a source electrode E1, and a drain electrode E2. The semiconductor layer SC is arranged above the undercoat layer 22. In the present embodiment, the semiconductor layer SC is arranged so as to be located above the light shielding layer SL described above in plan view.

The semiconductor layer SC of the NchTFT includes a first region, a second region, a channel region between the first region and the second region, and low-concentration impurity regions provided between the channel region and the first region and between the channel region and the second region. One of the first region and the second region functions as a source region, and the other of the first region and the second region functions as a drain region. Note that, as the semiconductor layer SC, various known semiconductor materials can be used, and for example, amorphous silicon, an oxide semiconductor, or the like may be used.

The gate insulating film 23 is provided above the undercoat layer 22 and the semiconductor layer SC. The gate electrode GE is arranged on the gate insulating film 23 and faces the channel region of the semiconductor layer SC. An interlayer insulating film 24 is provided on the gate insulating film 23 and the gate electrode GE. A source electrode E1, a drain electrode E2, and a cathode contact portion LL are provided on the interlayer insulating film 24. The source electrode E1 and the drain electrode E2 pass through contact holes formed in the gate insulating film 23 and the interlayer insulating film 24, respectively, and are electrically connected to the corresponding semiconductor layer SC. The planarizing film 25 is formed on the interlayer insulating film 24, the source electrode E1, the drain electrode E2, and the cathode contact portion LL. The planarizing film 25 covers the TFT and the cathode contact portion LL. The planarizing film 25 functions as a first insulating layer. Note that, the gate electrode GE functions not only as a gate electrode of the TFT but also as a storage capacitance electrode described later.

The source electrode E1 is connected to the first region of the semiconductor layer SC, and the drain electrode E2 is connected to the second region of the semiconductor layer SC. The source electrode E1 forms a storage capacitance Cs1 together with the interlayer insulating film 24 and the gate electrode (storage capacitance electrode) GE of the TFT. The cathode contact portion LL extends to an end portion of a peripheral end portion of the insulating substrate 21 and functions as a terminal for connecting the first circuit board 3 or the panel driver (drive IC) 5.

The gate electrode GE is not particularly limited as long as it is made of a conductive material such as a metal material, but is made of, for example, a molybdenum-tungsten alloy (MoW).

The source electrode E1, the drain electrode E2, and the cathode contact portion LL are not particularly limited as long as they are made of a conductive material such as a metal material, but for example, a three-layer stacked structure (Ti type/Al type/Ti type) can be used. The three-layer stacked structure (Ti type/Al type/Ti type) includes a lower layer made of a metal material containing Ti as a main component, such as Ti (titanium) and an alloy containing Ti, an intermediate layer made of a metal material containing Al as a main component, such as Al (aluminum) and an alloy containing Al, and an upper layer made of a metal material containing Ti as a main component, such as Ti and an alloy containing Ti.

The gate insulating film 23, the interlayer insulating film 24, and the planarizing film 25 are not particularly limited as long as they are made of an inorganic insulating layer or an organic insulating layer. For example, the gate insulating film 23 is made of a silicon oxide film ($SiO_2$), the interlayer insulating film 24 is made of a two-layer stacked structure of a silicon nitride film (SiN) and a silicon oxide film ($SiO_2$), and the planarizing film 25 is made of a photosensitive acrylic resin.

A conductive layer CL is provided on the planarizing film 25. An insulating layer 26 is provided on the conductive layer CL and the planarizing film 25. The insulating layer 26 functions as a second insulating layer. The conductive layer CL includes a conductive layer CL1 that passes through a contact hole formed in the planarizing film 25 and is electrically connected to the source electrode E1. The conductive layer CL is arranged below the first mounting electrode SE1 described later, and includes a conductive layer CL2 arranged to face the first mounting electrode SE1 through the insulating layer 26. The conductive layer CL includes a conductive layer CL3 that passes through the contact hole formed in the planarizing film 25 and is electrically connected to the cathode contact portion LL.

In the present embodiment, each of the conductive layers CL1, CL2, and CL3 is made of a transparent conductive material such as indium tin oxide (ITO) or indium zinc oxide (IZO). The insulating layer 26 is not particularly limited as long as it is made of an insulating material, but is made of, for example, a silicon nitride film. In the present embodiment, the conductive layer CL2, the insulating layer 26, and the first mounting electrode SE1 form an auxiliary capacitance Cs2. The auxiliary capacitance Cs2 is a capacitance provided for adjusting the amount of light emission current.

The first mounting electrode SE1 is provided on the insulating layer 26. The first mounting electrode SE1 passes through a contact hole formed in the insulating layer 26 and is electrically connected to the source electrode E1 through the conductive layer CL1. In the present embodiment, the first mounting electrode SE1 functions as a connection terminal for mounting a first electrode AN (anode) of the light emitting element 10 described later. The first mounting electrode SE1 is also referred to as a pixel electrode. A signal with a controlled a current value is supplied from the drive transistor DRT to the first mounting electrode SE1.

The insulating layer 27 is provided on the insulating layer 26 and the first mounting electrode SE1. The insulating layer 27 has an opening OP1 for mounting the light emitting element 10 on a part of a surface of the first mounting electrode SE1. Although not illustrated, the insulating layer 27 is provided on the first mounting electrode SE1 included in each of the plurality of pixels SP, and has the opening OP1 on a part of the surface of each of the plurality of first mounting electrodes SE1.

Figure 4:
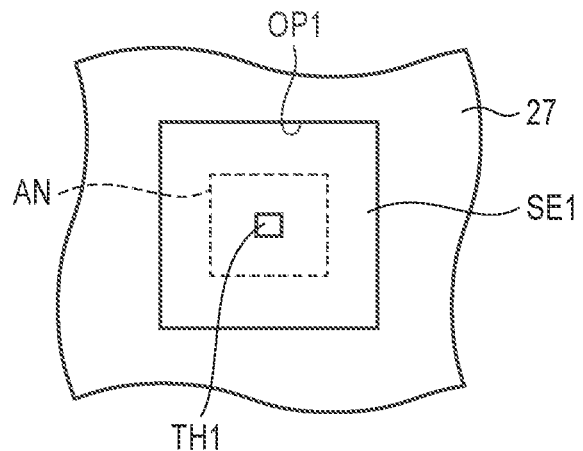
FIG. 4 is a plan view illustrating an example of a first through hole of the display device in FIG. 1.

In the present embodiment, the first mounting electrode SE1 has at least one first through hole TH1 at a position overlapping the first electrode AN in plan view. FIG. 4 is a plan view illustrating an example of the first through hole TH1. In the present embodiment, the first mounting electrode SE1 has one rectangular first through hole TH1 having an area of 10 μm×10 μm. The first through hole TH1 is located in a central portion of a region exposed by the opening OP1 of the insulating layer 27 and is located so as to overlap the first electrode AN. A size of the opening OP1 is formed to be slightly larger than that of the light emitting element 10 in consideration of a mounting deviation amount in the mounting process of the light emitting element 10. For example, when the light emitting element 10 has a mounting area of 30 μm×30 μm, the opening OP1 preferably has an area of about 40 μm×40 μm.

In the display area DA, the light emitting element 10 is mounted on the array substrate AR (first mounting electrode SE1). The light emitting element 10 includes the first electrode AN (anode), the second electrode CA (cathode), and a light emitting layer LI that emits light. The first electrode AN and the second electrode CA are arranged at positions facing each other with the light emitting layer LI interposed therebetween. Although only one light emitting element 10 is illustrated in FIG. 3, the light emitting element 10 having light emission colors of a first color, a second color, and a third color is provided in each pixel SP and mounted on the corresponding first mounting electrode SE1. The second electrode CA needs to be made of a transparent conductive material in order to extract the light emitted from the light emitting element 10, and is made of, for example, ITO or IZO.

In the present embodiment, the first mounting electrode SE1 and the first electrode AN of the light emitting element 10 are made of a metal material and joined to each other. The light emitting element 10 is mounted on the first mounting electrode SE1 by the joining.

The joining between the first electrode AN of the light emitting element 10 and the first mounting electrode SE1 is not particularly limited as long as good conduction can be secured between the first electrode AN and the first mounting electrode SE1, and the joining is not particularly limited as long as it is realized by laser irradiation transmitted through the stacked structure from the insulating substrate 21 to the insulating layer 27. In the present embodiment, the first mounting electrode SE1 and the first electrode AN are directly joined, and no other layer is interposed therebetween.

The first mounting electrode SE1 and the first electrode AN are not particularly limited as long as they are made of a metal material. For example, the first mounting electrode SE1 and the first electrode AN are made of a metal material such as Al, silver (Ag), gold (Au), indium (In), magnesium (Mg), molybdenum (Mo), titanium (Ti), tungsten (W), and tin (Sn), or a metal material such as an alloy containing them. The first mounting electrode SE1 and the first electrode AN may have a single-layer structure or a multilayer stacked structure. In the present embodiment, the metal material located at the joining interface between the first mounting electrode SE1 and the first electrode AN is preferably made of a material that reaches a melting point or a eutectic temperature by thermal energy applied by a laser irradiation, and is made of a material having a melting point or a eutectic temperature of, for example, 1000° C. or lower. In the present embodiment, the first mounting electrode SE1 and the first electrode AN may have a single-layer structure made of, for example, Al or an Al alloy.

As illustrated in FIG. 3, an element insulating layer 28 is provided on the array substrate AR on which the light emitting elements 10 are mounted. The element insulating layer 28 is filled in a gap portion between the light emitting elements 10 on the array substrate AR, and is made of, for example, an organic insulating material such as a photosensitive acrylic resin. Note that, the filling of the element insulating layer 28 is performed such that the surface of the second electrode CA of the light emitting element 10 is exposed.

The counter electrode CE is arranged at a position facing the first mounting electrode SE1 through the light emitting element 10. The counter electrode CE is formed on the element insulating layer 28 so as to be in contact with the surface of the second electrode CA, and is electrically connected to the second electrode CA. Since light emitted from the light emitting element 10 is extracted from the counter electrode CE side, the counter electrode CE is made of a transparent conductive material such as ITO or IZO. The counter electrode CE is commonly connected to the second electrodes CA of the plurality of light emitting elements 10 mounted in the display area DA. The counter electrode CE extends to the non-display region NDA, and is electrically connected to the cathode contact portion LL in the non-display region NDA. The counter electrode CE is electrically connected to the cathode contact portion LL through contact holes formed in the element insulating layer 28, the insulating layer 27, the insulating layer 26, and the planarizing film 25.

In the present embodiment, a light shielding layer or a metal layer that shields a laser is not arranged in a portion that is located between the insulating substrate 21 and the first mounting electrode SE1 and overlaps the first through hole TH1 in plan view. That is, as illustrated in FIG. 3, the light shielding layer SL and various wirings such as the gate electrode GE, the source electrode E1, and the drain electrode E2 are not arranged at positions overlapping the first through hole TH1 in plan view, but are arranged at positions deviated from each other.

In the display device 1 using the light emitting element 10 according to the present embodiment as a display element, the display panel 2 has a structure from the insulating substrate 21 to the counter electrode CE. Note that, a cover member such as a cover glass, a touch panel substrate, or the like may be provided on the counter electrode CE.

The display device according to the present embodiment can be manufactured, for example, by the following method.

First, an array substrate AR having a stacked structure from the insulating substrate 21 to the insulating layer 27 is prepared. Subsequently, the first electrode AN of the light emitting element 10 is arranged on the first mounting electrode SE1 exposed from the opening OP1 of the insulating layer 27. In this case, the first electrode AN of the light emitting element 10 is arranged on the first through hole TH1. Each of the first mounting electrode SE1 and the first electrode AN of the light emitting element 10 is made of a metal material, and has, for example, a single-layer structure made of an Al alloy.

Next, the lower surface of the region where the first mounting electrode SE1 and the first electrode AN overlap with each other is irradiated with a laser from the array substrate AR side. The laser is not particularly limited as long as it promotes joining between the first mounting electrode SE1 and the first electrode AN, and for example, a YAG a laser or a $CO_2$ laser is used. The irradiated laser passes through various insulating layers and the like constituting the array substrate AR, further passes through the first through hole TH1 of the first mounting electrode SE1, and reaches the lower surface of the first electrode AN. The laser reaching the lower surface of the first electrode AN applies thermal energy to the interface to be joined between the first mounting electrode SE1 and the first electrode AN, and joins the interface. For example, in a case where the first mounting electrode SE1 and the first electrode AN are made of an Al alloy, the first mounting electrode SE1 and the first electrode AN are melted and joined using the laser as thermal energy.

Next, the gap portion between the light emitting elements 10 on the array substrate AR is filled with the element insulating layer 28. Subsequently, the element insulating layer 28 is planarized so as to expose the surface of the second electrode CA of the light emitting element 10. Thereafter, the counter electrode CE is commonly connected to the second electrodes CA of the plurality of light emitting elements 10 mounted in the display area DA by the conventionally known method.

In the display device 1 according to the present embodiment, the first mounting electrode has the first through hole TH1. Therefore, when the laser is irradiated from the array substrate AR side to metal-join the first mounting electrode SE1 and the first electrode AN of the light emitting element 10, the laser can be directly applied to the first electrode AN through the first through hole TH1. The thermal energy generated by the laser irradiation moves to the interface between the first mounting electrode SE1 and the first electrode AN to be joined, and joins the interface. That is, as compared with the case where the first through hole TH1 is not provided, a strong metal joining can be formed at the interface. Therefore, according to the present embodiment, since the first mounting electrode SE1 and the first electrode AN can be strongly metal-joined, display failures of point defects can be suppressed, and the display device having high reliability can be provided.

Furthermore, in the display device 1 according to the present embodiment, in a region (in particular, a region overlapping the first through hole TH1) where the first mounting electrode SE1 and the first electrode AN overlap each other in plan view, the light shielding layer or the metal layer is not arranged in the region being located between the insulating substrate 21 and the first mounting electrode SE1. Specifically, the light shielding layer SL and various wirings such as the gate electrode GE, the source electrode E1, and the drain electrode E2 are preferably arranged so as not to overlap the first through hole TH1 in plan view. According to such a configuration, when the laser is emitted from the array substrate AR side, the laser having sufficient intensity can be directly emitted to the first electrode AN through the first through hole TH1 without being attenuated by the light shielding layer or the metal layer. As a result, the strong metal joining can be formed at the interface.

Furthermore, in the display device 1 according to the present embodiment, the conductive layer CL2 arranged below the first mounting electrode SE1 is preferably made of a transparent conductive material. When the conductive layer CL2 is made of a transparent conductive material in this manner, the intensity of the laser is not attenuated at the time of transmission through the conductive layer CL2 at the time of the laser irradiation. As a result, the strong metal joining can be formed at the interface between the first mounting electrode SE1 and the first electrode AN.

Note that, in the above embodiment, the first mounting electrode SE1 is described as being also referred to as a pixel electrode, but the present invention is not limited thereto. For example, the first mounting electrode may be a pad electrode or the like provided on a planarizing film made of an organic insulating material further provided on the pixel electrode. The first mounting electrode may be electrically connected to the pixel electrode through contact hole provided on the planarizing film, and may have a configuration in which the light emitting element may be mounted thereon.

Note that, each conductive layer CL1 to CL3 may not be formed depending on the configuration of the display device 1, and may have a configuration without the auxiliary capacitance $Cs_2$.

Figure 5:
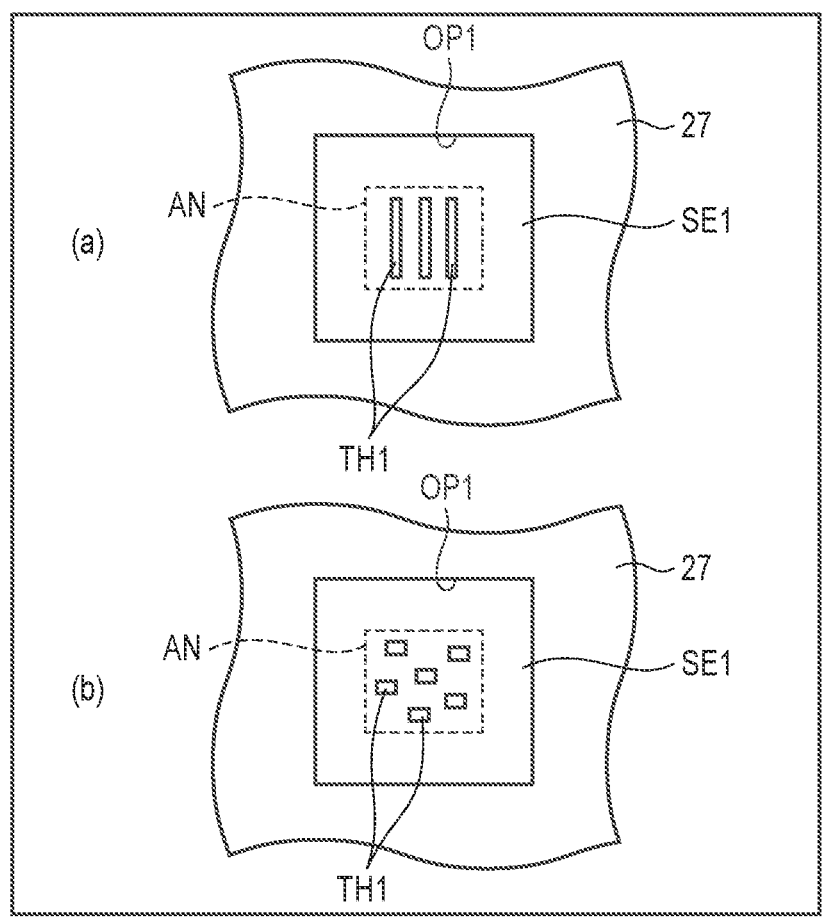
FIG. 5 is a plan view illustrating another example of the first through hole.

Note that, in the above embodiment, an example has been described in which the first mounting electrode SE1 has one first through hole TH1 at a central position of the region where the first mounting electrode SE1 and the first electrode AN overlap each other, but the number or shapes of the first through holes TH1 are not limited thereto. The first through hole TH1 may be formed in plural, and may have other shapes such as a circular shape and a slit shape. For example, as illustrated in (a) of FIG. 5, the first through hole TH1 may have a shape such as a slit arranged in parallel in the overlapping region while spaced apart from each other. In addition, as illustrated in (b) of FIG. 5, the first through hole TH1 may be configured such that a plurality of rectangular first through holes TH1 are dispersedly arranged in the overlapping region. According to such a configuration, as compared with the case where one first through hole TH1 is formed as illustrated in FIG. 4, the laser irradiation from the array substrate AR side can be more efficiently performed, and furthermore, the strong metal joining can be formed at the interface to be joined.

In addition, the method of joining a first mounting electrode SE1 and a first electrode AN of a light emitting element 10 is not limited to only the method of irradiating a region where a first mounting electrode SE1 and a first electrode AN overlap each other with a laser from an array substrate AR side. For example, stronger metal joining may be formed by combining a method of solid-state welding such as sinter or ultrasonic welding. An air layer may exist inside the through hole TH1 of the first mounting electrode connected to the first electrode AN through these processes, or the element insulating layer 28 may fill the through hole TH1.

Modified Example of First Embodiment

Figure 6:
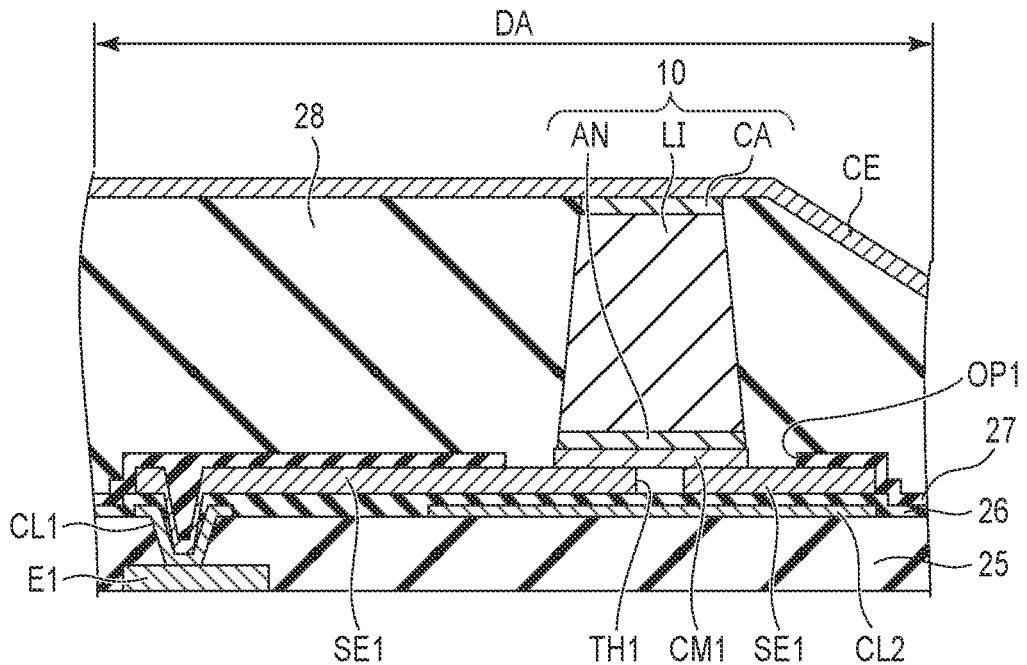
FIG. 6 is a diagram schematically illustrating an example of a partial cross-sectional structure of a display device according to modified example 1 of the first embodiment.

Next, a display device 1 according to a modified example of the first embodiment will be described. FIG. 6 is a diagram schematically illustrating an example of a partial cross-sectional structure of a display device according to modified example 1 of the first embodiment.

In the first embodiment, as illustrated in FIG. 3 described above, the case where the first electrode AN of the light emitting element 10 and the first mounting electrode SE1 are directly joined to each other has been described. In the modified example 1, a first low melting point metal layer CM1 is interposed between the first electrode AN of the light emitting element 10 and the first mounting electrode SE1, and the first electrode AN of the light emitting element 10 and the first mounting electrode SE1 are joined to each other by the first low melting point metal layer CM1. The first low melting point metal layer CM1 is made of a metal material having a melting point lower than that of the metal materials of the first mounting electrode SE1 and the first electrode AN.

The first low melting point metal layer CM1 is not particularly limited as long as it is made of a metal material having a melting point lower than that of the metal material forming the first mounting electrode SE1 and the first electrode AN, but is, for example, a metal layer made of a metal material such as indium (In), tin (Sn), and tellurium (Te), and an alloy thereof. For example, the low melting point metal material is a metal material having a melting point of 700° C. or lower, and preferably a metal material having a melting point of 400° C. or lower. For the first low melting point metal layer CM1, for example, an Sn—Pb alloy can be used.

The first mounting electrode SE1 and the first electrode AN are made of, for example, the same material as the first mounting electrode SE1 and the first electrode AN of the first embodiment, and preferably, a three-layer stacked structure (Ti type/Al type/Ti type, Mo type/Al type/Mo type), a two-layer stacked structure (Al type/Mo type, Ti type/Al type), or the like can be adopted.

The first mounting electrode SE1 and the first electrode AN having the three-layer stacked structure are not limited to Ti type/Al type/Ti type, and may be Mo type/Al type/Mo type. In the Mo type/Al type/Mo type, the first mounting electrode SE1 and the first electrode AN include a lower layer made of a metal material containing Mo as a main component, such as molybdenum (Mo) and an alloy containing Mo, an intermediate layer made of a metal material containing Al as a main component, such as Al and an alloy containing Al, and an upper layer made of a metal material containing Mo as a main component, such as Mo and an alloy containing Mo.

The first mounting electrode SE1 and the first electrode AN having the two-layer stacked structure have, for example, a lower layer made of a metal material containing Al as a main component and an upper layer made of a metal material containing Ti as a main component. The first mounting electrode SE1 includes, for example, a lower layer made of a metal material containing Mo as a main component and an upper layer made of a metal material containing Al as a main component.

The display device 1 according to Modified Example 1 of the above configuration can also obtain the same effects as those of the first embodiment. In such a configuration, the first mounting electrode SE1 and the first electrode AN are joined to interfaces to be joined through the first low melting point metal layer CM1. Therefore, it is possible to perform metal joining more favorably between the first mounting electrode SE1 and the first electrode AN of the light emitting element 10 by a laser irradiation without depending on the type of the metal material.

In the first low melting point metal layer CM1, the first low melting point metal layer may be formed on an opening OP1 of the first mounting electrode in advance before the joining step. A first low melting point metal layer CM1 can be formed by a method in which the low melting point material is locally deposited on the opening OP1 by a laser chemical vapor deposition (CVD) method, a method of applying a material such as cream solder containing the low melting point metal material, or the like. The low melting point metal layer CM1 may be formed on one or both of the first mounting electrode SE1 and the first electrode AN before mounting.

Figure 7:
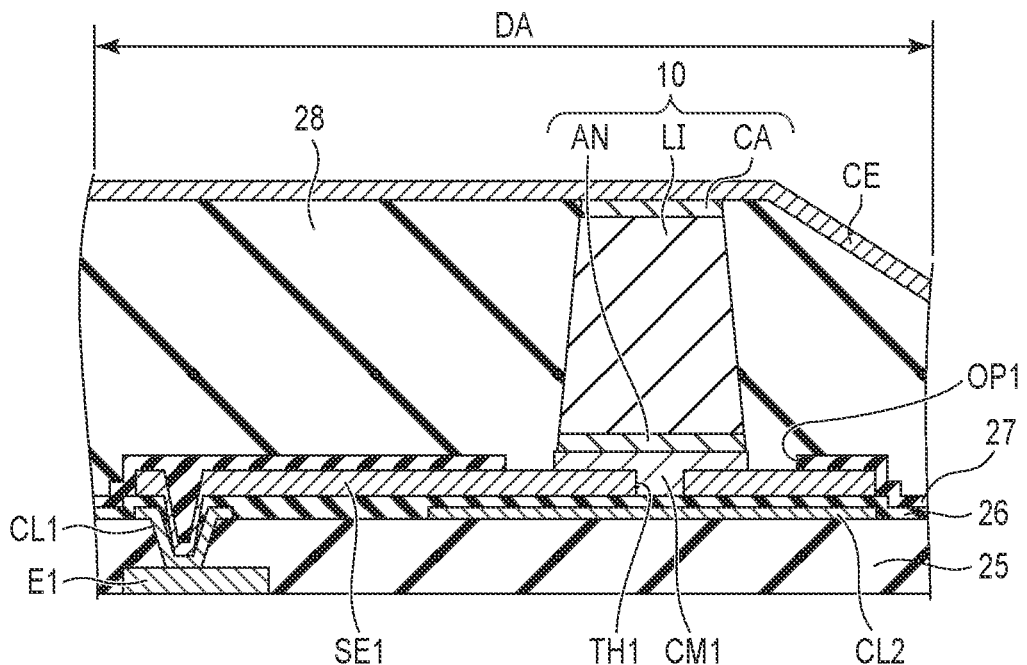
FIG. 7 is a diagram schematically illustrating an example of a partial cross-sectional structure of a display device according to modified example 2 of the first embodiment.

FIG. 7 is a diagram schematically illustrating an example of a partial cross-sectional structure of a display device according to modified example 2 of the first embodiment. Here, as illustrated in FIG. 7, the first low melting point metal layer CM1 may fill at least a part of the first through hole TH1. According to such a configuration, a joining area of the joining interface between a side surface of the first through hole TH1 and the first low melting point metal layer CM1 increases by the amount of the first low melting point metal layer CM1 filling the first through hole TH1 of the first mounting electrode SE1. This is preferable because an electrical connection of the interface is improved and the joining strength of the joining interface is further strengthened.

Note that, instead of the first low melting point metal layer CM1 in the modified example of the first embodiment, a cured layer of a conductive paste such as an Ag paste may be provided. Such a display device can be manufactured by interposing a conductive paste whose curing is accelerated by an ultraviolet laser or the like between the first mounting electrode SE1 and the first electrode AN, and irradiating the conductive paste with the laser through the first through hole TH1. Even with such a configuration, it is possible to obtain an effect similar to that of the display device according to the modified example of the first embodiment described above.

Second Embodiment

Figure 8:
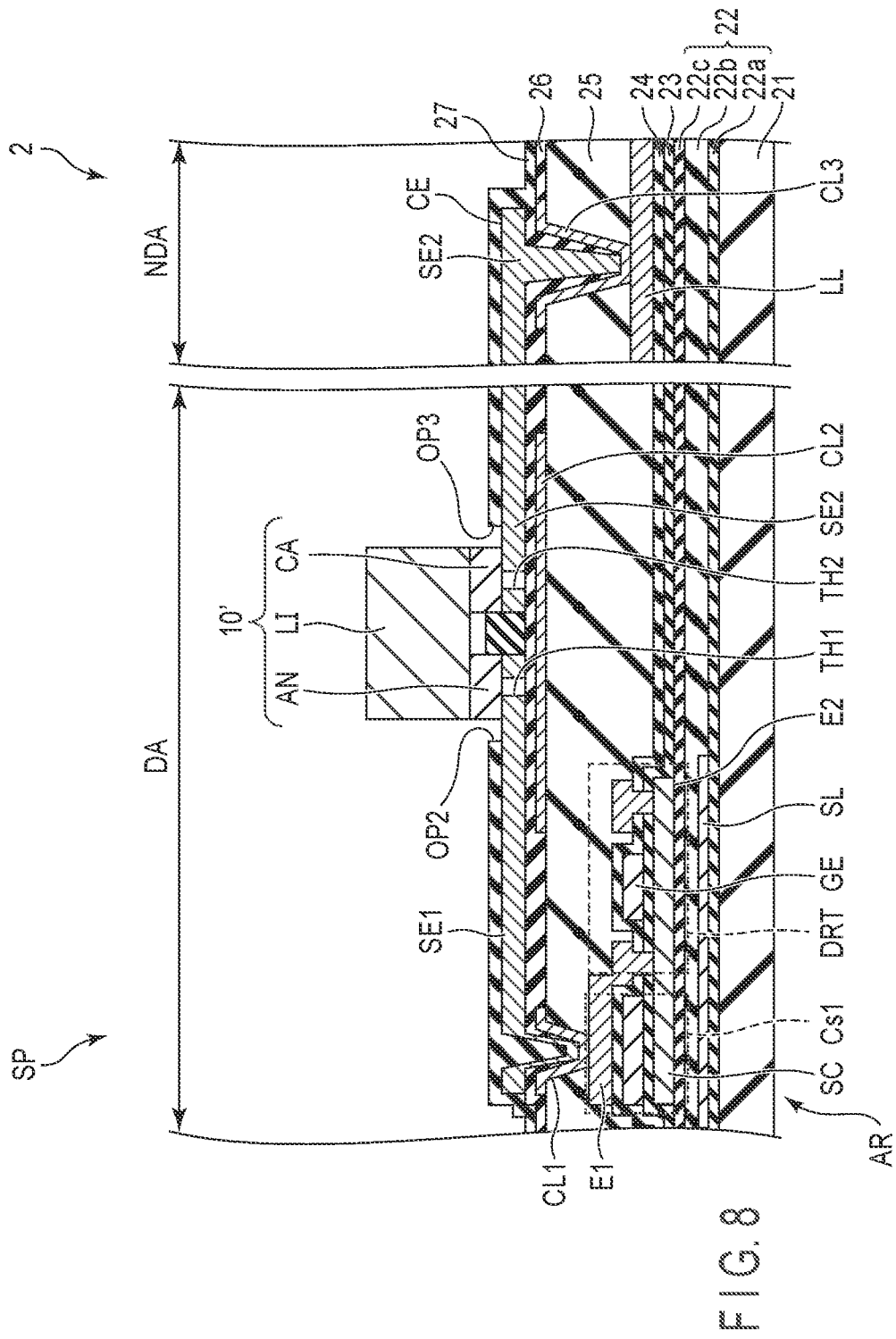
FIG. 8 is a diagram schematically illustrating an example of a partial cross-sectional structure of a display device according to a second embodiment.

Next, a display device 1 according to a second embodiment will be described with reference to FIG. 8. FIG. 8 is a diagram schematically illustrating an example of a partial cross-sectional structure of a display device according to a second embodiment.

As illustrated in FIG. 8, in the second embodiment, a display panel 2 further includes a second mounting electrode SE2. A first mounting electrode SE1 and a second mounting electrode SE2 are arranged on an insulating layer 26 at a desired distance from each other. An insulating layer 27 is provided on an insulating layer 26 so as to cover the first mounting electrode SE1 and the second mounting electrode SE2. The insulating layer 27 has openings OP2 and OP3 on a part of an upper surface of the first mounting electrode SE1 and a part of an upper surface of the second mounting electrode SE2, respectively. A part of the upper surface of the first mounting electrode SE1 is exposed from the opening OP2 of the insulating layer 27. A part of the upper surface of the second mounting electrode SE2 is exposed from the opening OP3 of the insulating layer 27. The second mounting electrode SE2 extends to a non-display region NDA and is electrically connected to a cathode contact portion LL through a conductive layer CL3 through a contact hole provided on a planarizing film 25 and the insulating layer 26.

Each light emitting element 10' includes a first electrode AN and a second electrode CA provided spaced apart from each other on a lower surface side of a light emitting layer LI. The first electrode AN of the light emitting element 10' is electrically connected to the first mounting electrode SE1 through the opening OP2 of the insulating layer 27. The second electrode CA (second electrode) of the light emitting element 10' is electrically connected to the second mounting electrode SE2 through the opening OP3 of the insulating layer 27. In the first mounting electrode SE1, at least one first through hole TH1 is opened at a position overlapping the first electrode AN in plan view. In the second mounting electrode SE2, at least one second through hole TH2 is opened at a position overlapping the first electrode AN in plan view.

In the second embodiment, the first mounting electrode SE1 and the first electrode AN are made of a metal material and metal-joined to each other. The first mounting electrode SE1 and the first electrode AN are not particularly limited as long as they are made of a metal material, and for example, the first mounting electrode SE1 and the first electrode AN are made of the same material as the first mounting electrode SE1 and the first electrode AN in the first embodiment.

In the second embodiment, the second mounting electrode SE2 and the second electrode CA are made of a metal material and joined to each other. The second mounting electrode SE2 and the second electrode CA are not particularly limited as long as they are made of a metal material, and for example, the first mounting electrode SE1 and the first electrode AN are made of the same material as the first mounting electrode SE1 and the first electrode AN in the first embodiment.

In the second embodiment, a light shielding layer or a metal layer that shields a laser light is not a portion arranged between the insulating substrate 21 and the first mounting electrode SE1 and between the insulating substrate 21 and the second mounting electrode SE2, which overlap the first and second through holes TH1 and TH2 in plan view. Specifically, in plan view, the light shielding layer SL and various wirings such as a gate electrode GE, a source electrode E1, and a drain electrode E2 are not arranged at positions overlapping the first and second through holes TH1 and TH2, respectively, but are arranged at positions deviated from each other.

According to the display device according to the second embodiment configured as described above, the same effects as those of the first embodiment can be obtained. The display device according to the second embodiment has a first through hole TH1 and a second through hole TH2 in the first mounting electrode SE1 and the second mounting electrode SE2 arranged on the insulating layer 26, respectively. As a result, when the light emitting element is mounted on the substrate, the laser passes through the first through hole TH1 and the second through hole TH2 to irradiate a first electrode AN portion near an interface between the first mounting electrode SE1 and the first electrode AN, and a second electrode CA portion located near the interface of the second mounting electrode SE2 and the second electrode CA, respectively. As a result, it is possible to form a strong joint at the interface between the first mounting electrode SE1 and the first electrode AN and the interface between the second mounting electrode SE2 and the second electrode CA, and it is possible to suppress disconnection of electrical connection at each interface when receiving a physical impact. Therefore, according to the display device according to the present embodiment, it is possible to provide a highly reliable display device capable of suppressing a display failure of a point defect.

Note that, in the above embodiment, an example has been described in which the first and second mounting electrodes SE1 and SE2 have one the first and second through holes TH1 and TH2, respectively, but similarly to the first through hole TH1 in the first embodiment, the number or shapes of the first and second through holes TH1 and TH2 are not limited thereto, and may be appropriately changed.

Modified Example of Second Embodiment

Figure 9:
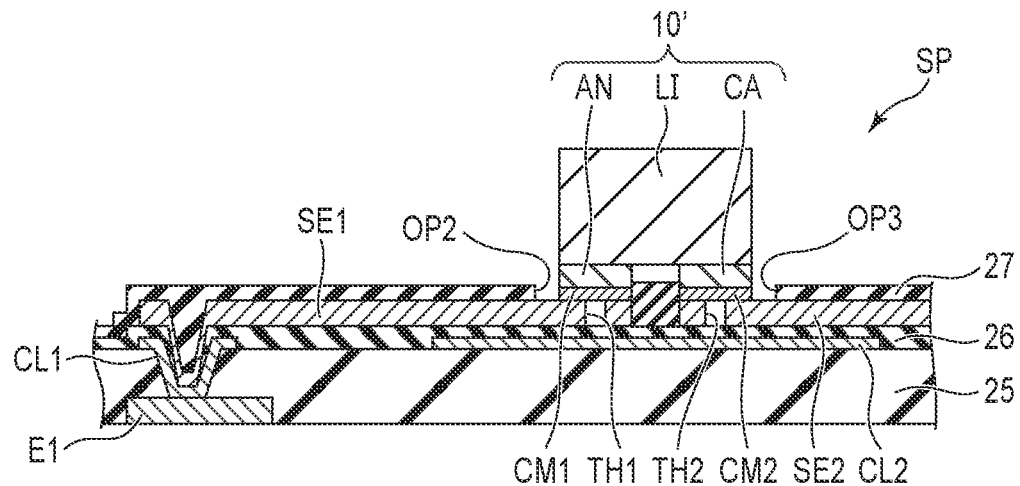
FIG. 9 is a diagram schematically illustrating an example of a partial cross-sectional structure of a display device according to modified example 1 of the second embodiment.

Next, a display device 1 according to a modified example of the second embodiment will be described. FIG. 9 is a diagram schematically illustrating an example of a partial cross-sectional structure of a display device according to modified example 1 of the second embodiment.

In Modified Example 1 of the second embodiment, a first low melting point metal layer CM1 made of a metal material having a melting point lower than that of the metal material is interposed between a first mounting electrode SE1 and a first electrode AN. In addition, a second low melting point metal layer CM2 made of a metal material having a melting point lower than that of the metal material is interposed between a second mounting electrode SE2 and a second electrode CA. The first low melting point metal layer CM1 and the second low melting point metal layer CM2 can be made of, for example, the same material as the first low melting point metal layer CM1 described in Modified Example 1 of the first embodiment.

The display device 1 according to Modified Example 1 configured as described above can also obtain the same effects as those of the second embodiment. Note that, in Modified Example 1, the first mounting electrode SE1 and the first electrode AN of the light emitting element 10' are joined to each other with the first low melting point metal layer CM1 interposed therebetween, and the second mounting electrode SE2 and the second electrode CA of the light emitting element 10' are joined to each other with the second low melting point metal layer CM2 interposed therebetween. Therefore, it is possible to favorably perform metal joining between these members without depending on the metal materials of the first and second mounting electrodes SE1 and SE2 and the first and second electrodes AN and CA.

Figure 10:
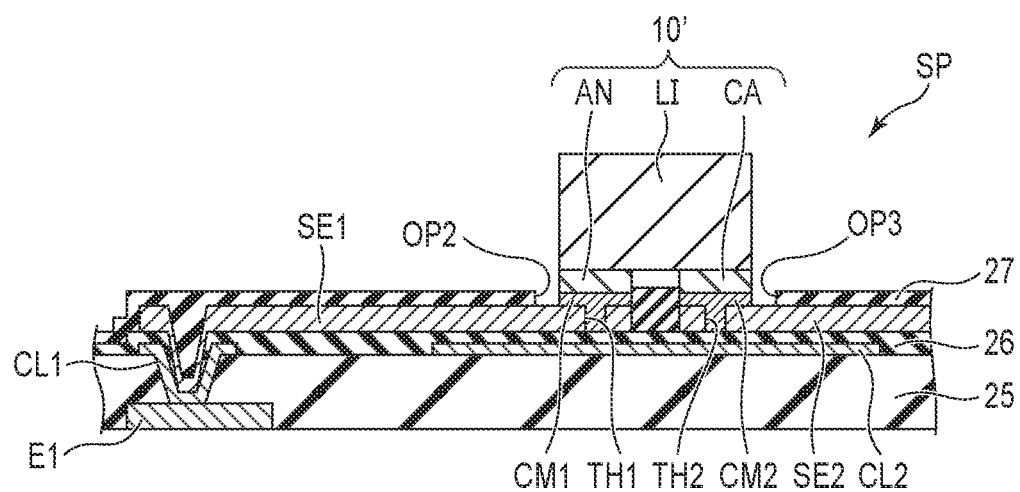
FIG. 10 is a diagram schematically illustrating an example of a partial cross-sectional structure of a display device according to modified example 2 of the second embodiment.

FIG. 10 is a diagram schematically illustrating an example of a partial cross-sectional structure of a display device according to modified example 2 of the second embodiment. Here, as illustrated in FIG. 10, the first low melting point metal layer CM1 and the second low melting point metal layer CM2 may fill at least a part of the first through hole TH1 and the second through hole TH2, respectively. According to such a configuration, as the first low melting point metal layer CM1 fills at least a part of the first through hole TH1 of the first mounting electrode SE1 and the second low melting point metal layer CM2 fills at least a part of the second through hole TH2 of the second mounting electrode SE2, a joining area of the joining interface increases, an electrical connection of the interface is improved, and the joining strength of the interface between the first mounting electrode SE1 and the first electrode AN of the light emitting element 10' and the interface between the second mounting electrode SE2 and the second electrode CA of the light emitting element 10' can be further strengthened.

Note that, as described in the Modified Example of the first embodiment, instead of the first and second low melting point metal layers CM1 and CM2 in the Modified Example of the second embodiment, a cured layer of a conductive paste such as an Ag paste may be provided. Even with such a configuration, it is possible to obtain an effect similar to that of the display device according to the modified example of the second embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a substrate;
a drive transistor that is provided above the substrate;
a first insulating layer that is provided above the substrate so as to cover the drive transistor;
a first mounting electrode that is arranged above the first insulating layer, and receives a signal having a controlled current value from the drive transistor; and
a light emitting element that is mounted on the first mounting electrode and has a first electrode and a second electrode, the first electrode being electrically connected to the first mounting electrode,
wherein the first mounting electrode and the first electrode are made of a metal material and joined to each other, and
the first mounting electrode has at least one first through hole at a position overlapping the first electrode in plan view.

2. The display device according to claim 1, wherein the light emitting element is a micro light-emitting diode.

3. The display device according to claim 1, wherein
a light shielding layer or a metal layer that shields a laser is not arranged in a portion overlapping the first through hole in a plan view and positioned between the substrate and the first mounting electrode.

4. The display device according to claim 1, further comprising:
a second insulating layer that is provided above the first insulating layer; and
a conductive layer that is arranged between the first insulating layer and the second insulating layer,
wherein the first mounting electrode is arranged above the second insulating layer, and
the conductive layer electrically connects the first mounting electrode and the drive transistor, and is made of a transparent conductive material.

5. The display device according to claim 1, wherein a first low melting point metal layer made of a metal material having a melting point lower than that of the metal material forming the first mounting electrode and the first electrode is interposed between the first mounting electrode and the first electrode, and the first mounting electrode and the first electrode are joined to each other by the first low melting point metal layer.

6. The display device according to claim 5, wherein the first low melting point metal layer fills at least a part of the first through hole.

7. The display device according to claim 1, further comprising: a counter electrode that is arranged at a position facing the first mounting electrode through the light emitting element, wherein the second electrode is electrically connected to the counter electrode.

8. The display device according to claim 1, further comprising:
a second mounting electrode that is arranged above the first insulating layer,
wherein the second electrode is electrically connected to the second mounting electrode,
the second mounting electrode and the second electrode are made of a metal material and joined to each other, and
the second mounting electrode has at least one second through hole at a position overlapping the second electrode in plan view.

9. The display device according to claim 8, wherein a second low melting point metal layer made of a metal material having a melting point lower than that of the metal material forming the second mounting electrode and the second electrode is interposed between the second mounting electrode and the second electrode, and the second mounting electrode and the second electrode are joined to each other by the second low melting point metal layer.

10. The display device according to claim 8, wherein
a light shielding layer or a metal layer that shields a laser is not arranged in a portion overlapping the second through hole in a plan view and positioned between the substrate and the second mounting electrode.

* * * * *